United States Patent [19]

Jeon et al.

[11] Patent Number: 5,103,166

[45] Date of Patent: Apr. 7, 1992

[54] SEMICONDUCTOR INTEGRATED CIRCUIT CHIP HAVING AN IDENTIFICATION CIRCUIT THEREIN

[75] Inventors: Dong-su Jeon, Seoul; Yong-sik Seok, Taegu, both of Rep. of Korea

[73] Assignee: Samsung Electronics Co., Ltd., Kyunggi, Rep. of Korea

[21] Appl. No.: 578,284

[22] Filed: Sep. 6, 1990

[30] Foreign Application Priority Data

May 23, 1990 [KR] Rep. of Korea ............... 90-7481

[51] Int. Cl.$^5$ .................... G01R 27/02; G06F 11/22
[52] U.S. Cl. ..................... 324/158 R; 324/73.1; 324/537; 307/304; 437/8
[58] Field of Search ........... 324/158 R, 158 P, 158 D, 324/158 T, 537, 73.1; 307/303, 304; 437/8, 7

[56] References Cited

U.S. PATENT DOCUMENTS

| | | | |
|---|---|---|---|
| 3,639,787 | 2/1972 | Lee | 307/304 |
| 4,020,365 | 4/1977 | Weir | 307/304 |
| 4,150,331 | 4/1979 | Lacher | 324/537 |
| 4,301,403 | 11/1981 | Hawkes et al. | 324/537 |
| 4,465,973 | 8/1984 | Countryman, Jr. | 324/537 |
| 4,510,673 | 4/1985 | Shils et al. | 437/209 |
| 4,549,096 | 10/1985 | Hoffman | 307/304 |
| 4,595,875 | 6/1986 | Chan et al. | 324/537 |
| 4,698,589 | 10/1987 | Blankenship et al. | 324/158 R |
| 4,719,418 | 1/1988 | Flakes et al. | 324/158 R |
| 4,743,841 | 5/1988 | Takeuchi | 324/158 R |
| 4,779,043 | 10/1988 | Williamson, Jr. | 324/158 R |
| 4,853,628 | 8/1989 | Gouldsberry et al. | 324/158 R |
| 4,942,358 | 7/1990 | Davis et al. | 324/158 R |
| 4,961,053 | 10/1990 | Krug | 437/8 |
| 4,970,454 | 11/1990 | Stambaugh et al. | 324/158 R |
| 4,992,727 | 2/1991 | Simpson et al. | 324/73.1 |

FOREIGN PATENT DOCUMENTS 2167196A 5/1986 United Kingdom ........... 324/158 R

Primary Examiner—Kenneth A. Wieder
Assistant Examiner—William J. Burns
Attorney, Agent, or Firm—Cushman, Darby & Cushman

[57] ABSTRACT

A semiconductor integrated circuit chip has an identification circuit connected between a power voltage supply terminal and one of the input terminals of the chip. The identification circuity includes a voltage limiter to limit the input potential difference between the power voltage supply terminal and the input terminal to a predetermined voltage level. The identification circuit further includes an option device connected to the voltage limiter to provide identification information of the chip. According to the identification circuit, chip identification testing may be achieved with existing input-/output and power supply terminals, thereby eliminating the need for extra test and diagnosis pins or additional identification equipment employed during testing.

12 Claims, 5 Drawing Sheets

SEMICONDUCTOR INTEGRATED CIRCUIT CHIP HAVING AN IDENTIFICATION CIRCUIT THEREIN

FIELD OF THE INVENTION

The present invention relates to a semiconductor integrated circuit chip, and more particularly, to a semiconductor integrated circuit (IC) chip having an identification circuit within the chip for sorting chips during manufacturing.

BACKGROUND INFORMATION

To satisfy the increasing demand for function specific devices, semiconductor manufacturers have diversified their products to accommodate different operating modes. As the storage capacity of DRAM devices increase to the 1M and 4M bit range, operating modes in addition to a basic operating mode have been developed. In 1M or 4M DRAM, the operating modes are separated into 1 bit, 4 bit, 8 bit, etc., according to the desired output data and are separated into a fast page mode, a nibble mode, a static column mode, etc., according to an input control signal. Therefore, to satisfy the user's demands, the DRAM suppliers are providing a diversified line of DRAMs which perform the different operating modes according to various selected modes by optionally providing the specific operating modes in addition to the basic operating mode of DRAM during the manufacturing process. For example, in a single DRAM manufacturing line, the fast page mode may be the basic operating mode and the nibble mode or the static column mode may be optionally produced during the manufacturing process.

An optional provision is performed wafer by wafer during the production of DRAMS. After the DRAM is manufactured, the wafer is separated into individual dies or chips through a scribing process. Next, these chips are sorted according to their specific operational modes. The chips are then packaged into a tailored package through the processes of die mounting, wire bonding and molding. The packaged DRAM is marked with the product data (i.e., the serial number, manufacture date and manufacturing line) and forwarded as a final product.

Unfortunately, since the DRAMs are manufactured in a single manufacturing line, the chips having one type of operational mode are often mixed up during the chip sorting process with chips having other types of operational modes. As a result, the chips having the nonconforming operating modes are deemed erroneous during the testing step and treated as an article of inferior quality. Thus, the production yield is reduced.

To prevent the chips having the different operating modes from being mixed, very careful attention is required during the sorting process, thereby reducing manufacturing operation efficiency. Accordingly, a technique is needed which identifies the various chips during the testing step.

Techniques for identifying semiconductor chips have been disclosed in U.S. Pat. Nos. 4,150,331 and 4,510,673. U.S. Pat. No. 4,150,331 describes a technique which identifies each chip by using a programmable circuit device on the chip surface. The circuit device programs an identification code according to whether or not a diode is formed between an additionally provided test and diagnostic pin and a selected input/output pin.

However, this technique is disadvantageous in that an extra test pin is required. Thus, the package size is larger which increases the unit price of the chip.

U.S. Pat. No. 4,510,673 discloses a technique which employs a laser apparatus to place a specific identification mark (e.g., the serial number, manufacturing line, and date) on the back surface of the semiconductor chip. The identification mark may then be identified by a laser or optical apparatus. However, this technique is disadvantageous in that an expensive laser apparatus is required to mark the chips.

SUMMARY OF THE INVENTION

One object of present invention is to provide a semiconductor integrated circuit chip having an identification circuit which does not require an extra test and diagnostic pin, yet solves the above mentioned problems in the prior art.

Another object of the present invention is to provide a semiconductor integrated circuit chip having an identification circuit that is simple in construction and facilitates the identification of the semiconductor chip.

In order to accomplish the aforementioned objects of the present invention, one embodiment provides a semiconductor integrated circuit chip having a pair of power voltage supply terminals and a plurality of input terminals with an indentification circuit connected between one of the power voltage supply terminals and one of the input terminals. The identification circuit comprises a voltage limiter and an option device. The voltage limiter has a predetermined limiting voltage level which limits the input potential difference between the power voltage supply terminal and the selected input terminal. The option device is connected in series with the voltage limiter and identifies the chip according to whether a current path is formed during the manufacturing process of said chip.

Another embodiment, according to the present invention, provides a semiconductor integrated circuit chip having a pair of power voltage supply terminals, at least three input terminals and an identification circuit, which is connected with one of the power voltage supply terminals and three of the input terminals. The identification circuit comprises a voltage limiter, an option device, and a switch device. The voltage limiter limits the input potential difference between the power voltage supply terminal and one of the three input terminals to a predetermined limiting voltage level and generates a predetermined control voltage by dividing the limiting voltage level. The option device is connected between the remaining two input terminals to identify the chip according to whether a current path is formed during the manufacturing process of said chip. The switch device is connected in series with the option device and is turned on by the control voltage supplied from the voltage limiter.

According to these embodiments, the present invention provides an identification circuit on the chip without adding an extra test pin.

DETAILED DESCRIPTION OF THE INVENTION

Figure 1:
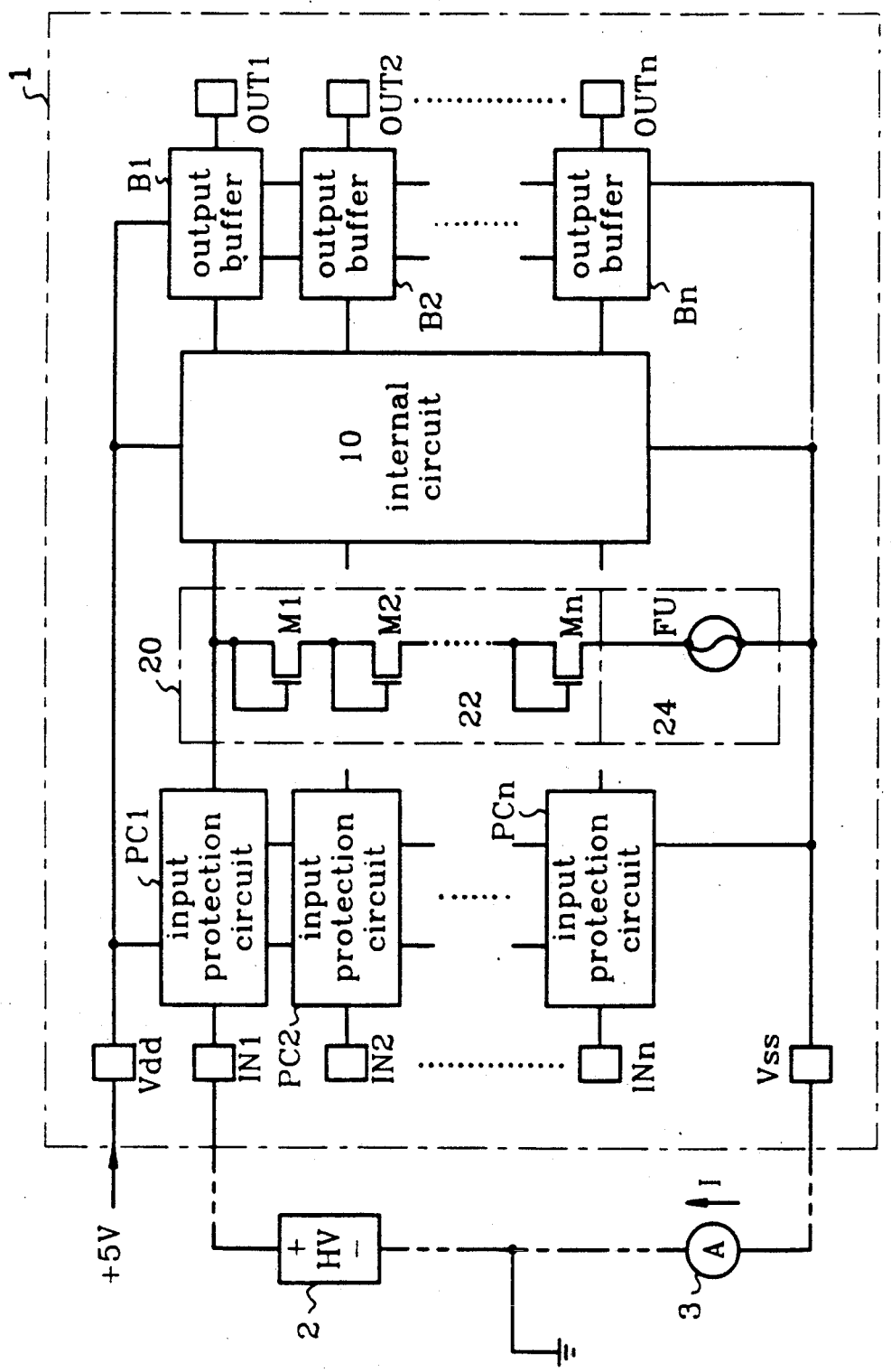
FIG. 1 shows a first embodiment of a semiconductor integrated circuit chip having an indentification circuit according to the present invention.

FIG. 1 shows a semiconductor integrated circuit chip 1 having an internal circuit 10, input protection circuits PC1 to PCn, output buffers B1 to Bn, input terminals IN1 to INn, output terminals OUT1 to OUTn and a pair of power supply terminals Vdd and Vss. A power source (not shown) is coupled to the IC chip 1 to supply a power voltage (e.g. 5 V) to the power voltage supply terminal Vdd and a ground potential to the power voltage supply terminal Vss. The internal circuit 10 is coupled to the voltage supply terminals Vdd and Vss. The internal circuit 10 performs predefined functions according to the input signals received at the input terminals IN1 to INn and generates in predetermined output signal through the output terminals OUT1 to OUTn. The input terminals IN1 to INn are connected to the internal circuit 10 via respective input protection circuits PC1 to PCn to prevent noise voltage (such as power surges, or the like) from damaging the internal circuit 10.

The output terminals OUT1 to OUTn are connected to the internal circuit 10 via output buffers B1 to Bn, respectively.

An identification circuit 20 is connected between an input terminal IN1 and the power voltage supply terminal Vss of the IC chip 1. The identification circuit 20 comprises a voltage limiter 22 and an option device 24. The voltage limiter 22 limits an input signal supplied between the input terminal IN1 and the power voltage terminal Vss to a predetermined logic level which is to be supplied to the internal circuit 10. The voltage limiter 22 consists of a plurality of serially connected MOS transistors $M_1$ to Mn, wherein the gates of each MOS transistor are connected to the respective drains. The voltage limiter 22 sets the predetermined logic level by the sum of threshold voltages of the MOS transistors M1 to Mn.

For example, the predetermined logic level may be set approximately to slightly more than 2.5 V when a TTL level is supplied to the input terminal; and to slightly more than +3 V when a CMOS level is supplied to the input terminal.

Although, a diode-configuration of MOS transistors is used in this embodiment, it will be noted that any unilateral current flow device having a predetermined threshold voltage (for example, a PN junction diode, a Zener diode or the like) may be used as the voltage limiter 22.

The option device 24 is coupled in series with the voltage limiter 22. In this embodiment, the option device 24 comprises a fuse FU which, depending upon whether opened or closed, identifies the IC Chip 1. To provide the option device 24, a simple option processing technique connects or disconnects the fuse formed during the manufacturing process. Then, identification information is written to the IC Chip 1 to open the fuse via a laser zappling process if necessary. For example, during the manufacturing process of the chip 1, a connected fuse FU represents a DRAM having a fast page mode operation and a disconnected fuse FU represents having a nibble mode operation.

Accordingly, the IC chip 1 may be identified during a testing step according to whether current flows through the identification circuit 20. The input terminal IN1 of the IC chip 1 is connected to a predetermined high voltage source 2 (for example, a voltage source of 15 V) and the power voltage supply terminal Vss is connected to a amperemeter 3. If current flows, the IC chip 1 is identified as a DRAM for high page mode operation, whereas if current does not flow, the IC chip 1 is identified as DRAM for nibble mode operation.

The voltage limiter 22 provides normal operation of the internal circuit 10 when the fuse FU remains connected to represent the fast page mode of operation. When the fuse FU is disconnected for the nibble mode case, the input signal is transferred to the internal circuit 10 and the existence of the identification circuit 20 does not inhibit the normal operation of the chip 1. However, when the fuse FU remains connected to represent the fast page mode operation the input terminal IN1 would always be at logic "0" through the fuse FU. Specifically, when logic "0" is applied to the input terminal IN1, logic "0" is input to the internal circuit 10 regardless of the connection of the identification circuit 20. But, when logic "1" is applied to the input terminal IN1, the current flows through the identification circuit 20, thus generating a predetermined voltage difference in the voltage limiter 22 which enable the internal circuit 10 to receive the desired logic "1".

The identification circuit 20 is preferably connected to the input terminal IN1 through the input protection circuit PC1, which protects the identification circuit 20 from damage caused by an external surge, or the like.

Figure 5:
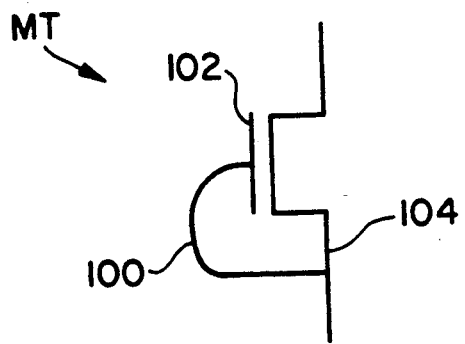
FIG. 5 illustrates another embodiment of an option device according to the present invention.

It should be noted that the option device 24 may comprise, as shown in FIG. 5, a MOS transistor MT having a metal wire 100 disposed between the gate 102 and source 104 thereof. The metal wire is formed during a metalization step of the chip 1. To distinguish the different operating modes and thereby identify the chips, the wire may be connected or disconnected.

Figure 2:
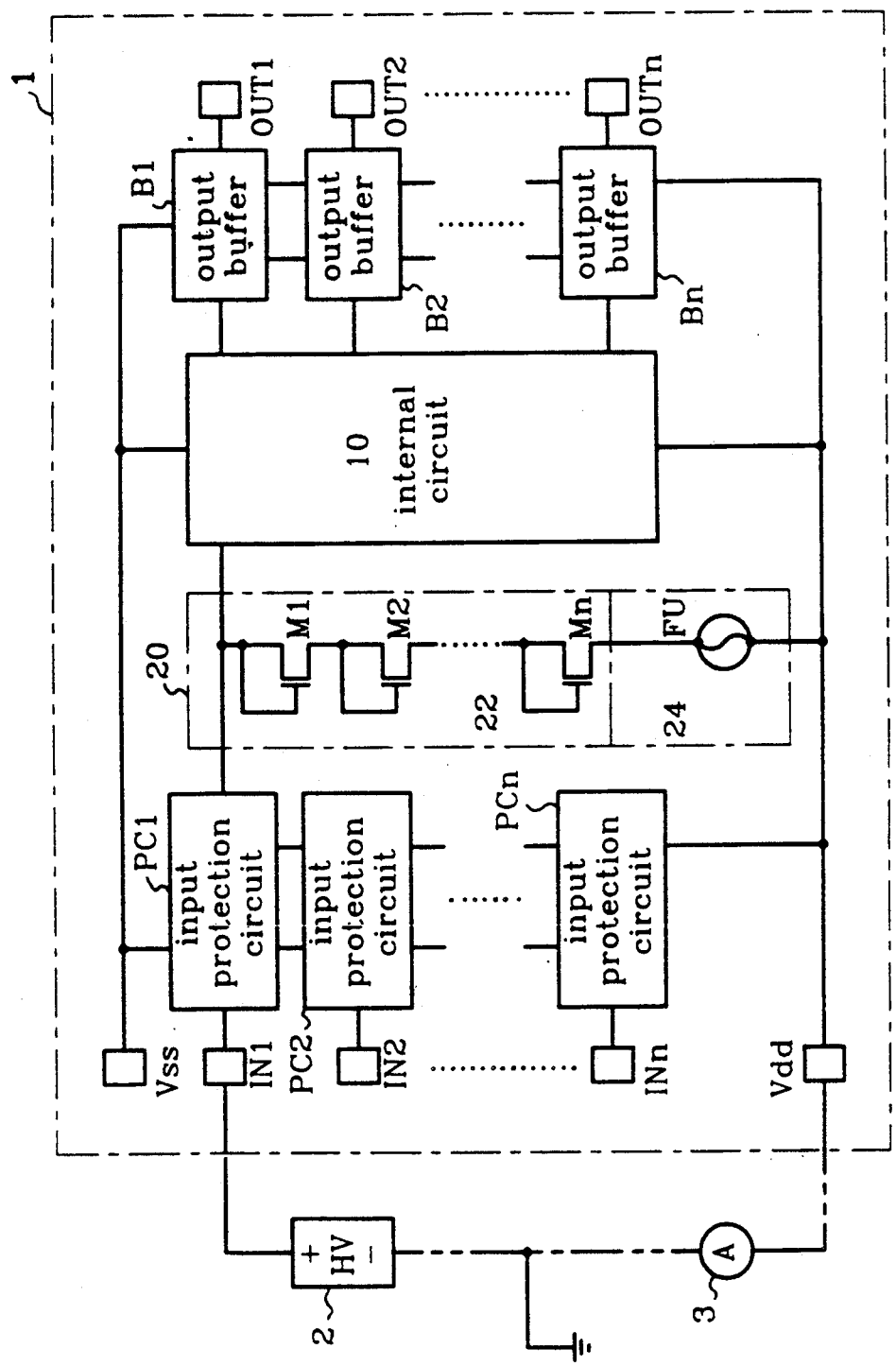
FIG. 2 shows a second embodiment of a semiconductor integrated circuit chip having an identification circuit according to the present invention.

FIG. 2 illustrates another embodiment of the semiconductor integrated circuit chip 1 according to the present invention, wherein the circuit configuration is the same as that of the first embodiment, except that the identification circuit 20 is connected between the power voltage supply terminal Vdd and the input terminal IN1. Since the voltage of +15 V supplied to the input terminal during the identification test is higher than the voltage of +5 V supplied from the power voltage supply terminal Vdd, the underlying principles of operation of the chip 1 is the same as that of the first embodiment.

Figure 3:
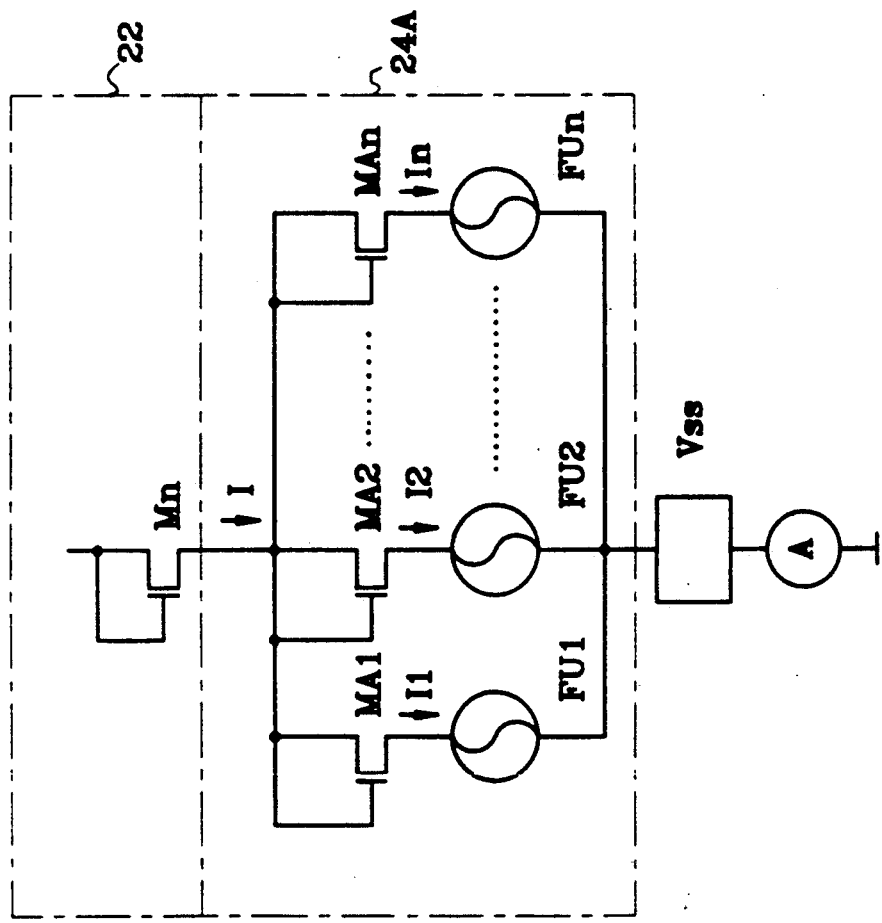
FIG. 3 is a circuit diagram showing a modified option device for use in the embodiments shown in FIG. 1 and FIG. 2.

FIG. 3 illustrates a modification of the option device 24 for identifying two or more kinds of chips. The option device 24 comprises a plurality of MOS transistor MA1 to MAn, the gates of which are connected to the drains thereof, connected in series to a corresponding plurality of fuses FU1 to FUn. The serially connected paths of MOS transistors and fuses are connected in parallel between the voltage limiter 22 and the power voltage supply terminal Vss (or Vdd).

Current values passing through the option device 24 are used as identification information. Table 1 shows an example of an option device 24 having three fuses FU1, FU2, and FU3.

TABLE 1

| | fuse connection | | | identification information |
|---|---|---|---|---|
| | FU 1 | FU 2 | FU 3 | |
| fast page mode | connected | connected | connected | $I_1 + I_2 + I_3$ |
| nibble mode | disconnected | connected | connected | $I_2 + I_3$ |
| static column mode | disconnected | disconnected | connected | $I_3$ |
| other mode | disconnected | disconnected | disconnected | 0 |

Figure 4:
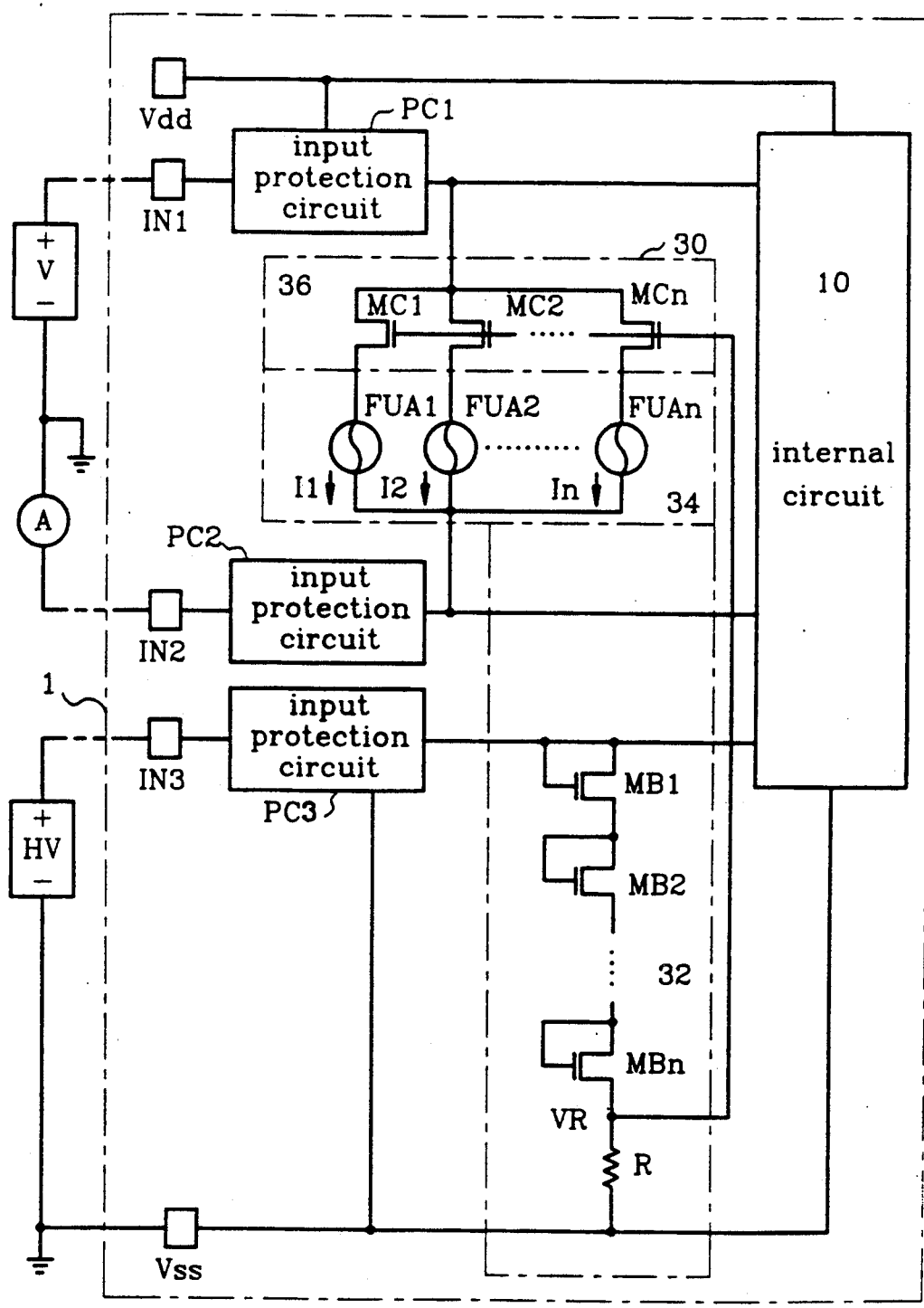
FIG. 4 illustrates a third embodiment of a semiconductor integrated circuit chip having an identification circuit according to the present invention.

FIG. 4 shows another embodiment of an identification circuit according to the present invention for identifying two or more kinds of chips. The identification circuit 30 is connected with the power source supply terminal Vss and three input terminals IN1 to IN3. The identification circuit 30 comprises a voltage limiter 32, an option device 34 and a switch device 36.

The voltage limiter 32 is coupled between the input terminal IN3 and the power supply terminal Vss to limit the input voltage difference applied therebetween to the logic level received in the internal circuitry 10. The voltage limiter 32 comprises a plurality of MOS transistor MB1 to MBn, each having a gate connected to a corresponding drain, and a resistor R. The voltage limiter 32 generates a control voltage VR across the resistor R and supplies this control voltage VR to the switch device 36.

The switch device 36 is connected to the option device 34 between the input terminals IN1 and IN2. The switch means 36 consists of a plurality of MOS transistors MC1 to MCn wherein the drains of each transistor MC1 to MCn are connected to the input terminal IN1; the gates are coupled to receive the control voltage VR; and the sources are connected to corresponding fuses FUA1 to FUAn of the option device 34, which will be described below. The switch device 36 is turned on by the control voltage VR generated by the voltage limiter 32.

In this embodiment, the option device 34 consists of a plurality of fuses FUA1 to FUAn, each of which is serially connected to the source of the corresponding MOS transistor MC1 to MCn of the switch device 36. The n serial paths of a MOS transistor and a fuse are connected in parallel between the input terminals IN1 and IN2. The fuses are connected or disconnected during the manufacturing process of the chip to provide the required identification information.

To identify the chips, a power source V of a predetermined voltage (for example, 5 V) is connected to the input terminal IN1, an amperemeter A is connected to the input terminal IN2, and a power source of higher voltage (for example, 15 V) is connected between the input terminal IN3 and the power supply terminal Vss. Upon supply of these power sources, current flows through voltage limiter 32 which generates the control voltage VR. The control voltage VR turns on MOS transistors MC1 and MCn of the switch device 36 permitting the current to flow between the input terminals IN1 and IN2. The current flow, indicated on the amperemeter A changes, according to whether fuses FUA1 to FUAn are connected or disconnected. Table 2 shows the current values of an identification circuit having three fuses FUA1, FUA2 and FUA3 in the option device 34.

TABLE 2

| fuse connection state | | | identification information |
|---|---|---|---|
| FUA 1 | FUA 2 | FUA 3 | |
| connected | connected | connected | $I_1 + I_2 + I_3$ |
| disconnected | connected | connected | $I_2 + I_3$ |
| disconnected | disconnected | connected | $I_3$ |
| disconnected | disconnected | disconnected | 0 |

As illustrated in Table 2, the chips can be written with identification information to identify four different operation modes.

When the chip 1 is not in the chip identification test, the gates of the MOS transistors MC1 to MCn of the switch device 36 are grounded via the resistor R to ensure normal operation of the chip 1.

According to the present invention, chip identification information is written to the chip by optionally connecting or disconnecting the fuses of the identification circuit during the wafer manufacturing process. Then, during the normal testing phase of the assembly process, the written identification information may be used to sort the chips according to their operational modes.

In the chip of the present invention, the chip identification test uses existing input/output terminals and power supply terminals. Thus, unlike conventional methods, the chip of the present invention does not require extra test pins or expensive laser equipment to identify the chip. Accordingly, the present invention may be easily implemented without additional unit costs.

It should be noted that the chip of the present invention as described in the preferred embodiments can be adopted to various applications upon request. Thus, the present chip may be modified in various forms within the scope of the present invention defined in the appended claims.

What is claimed is:

1. In a semiconductor integrated circuit chip having a pair of power supply terminals, a plurality of input terminals and an identification circuit means connected between one of said power supply terminals and one of said input terminals, the improvement wherein said identification circuit means comprises:
   a voltage limiter for limiting the input potential difference between said one power supply terminal and said one input terminal to a predetermined limiting voltage level; and
   option means connected in series to said voltage limiter for providing identification information indicative of said chip.

2. A semiconductor integrated chip as defined in claim 1, wherein said voltage limiter comprises a plurality of serially connected MOS transistors, each of said MOS transistors having a gate connected to a drain thereof, whereby said predetermined limiting voltage level is set to be a sum of the threshold voltages of said MOS transistors.

3. A semiconductor integrated circuit chip as defined in claim 1, wherein said option means comprises a fuse which is optionally one of connected or disconnected.

4. A semiconductor integrated circuit chip as defined in claim 1, wherein said option means comprises a MOS transistor having a gate and a source which are optionally one of connected or disconnected by a metal wire.

5. A semiconductor integrated circuit as defined in claim 1, wherein said option means comprises a plurality of identification paths connected in parallel, each said identification path having a MOS transistor connected in series to a fuse, said MOS transistor having a gate connected to a drain thereof, and said identification information being set according to said fuses being optionally one of connected or disconnected.

6. In a semiconductor integrated circuit chip having a pair of power supply terminals, at least three input terminals and an identification circuit means connected with one of said power supply terminals and with said three input terminals, the improvement wherein said identification circuit means comprises: voltage limiting means for limiting the potential difference between said one power supply terminal and one of said three input terminals to a predetermined limiting voltage level and for generating a predetermined control voltage by dividing the limiting voltage level;

option means connected between the remaining two of said three input terminals for providing identification information indicative of said chip; and switch means connected in series to said option means, said switch means being controlled by said control voltage supplied from said voltage limiting means.

7. A semiconductor integrated circuits chip as defined in claim 6, wherein said voltage limiting means comprises:

a plurality of serially connected MOS transistors, each of which has a gate connected to a respective drain thereof; and a resistor connected to said plurality of MOS transistors, whereby said limiting voltage level is a sum of a terminal voltage of said resistor and the threshold voltages of said MOS transistors, and said control voltage is said terminal voltage of said resistor.

8. A semiconductor integrated circuits chip as defined in claim 6, wherein said option means comprises a plurality of fuses and said switch means comprises a plurality of MOS transistors, each of said plurality of fuses being serially connected to a corresponding one of said plurality of said MOS transistors, said MOS transistors having gates coupled to receive said control voltage, and said identification information of said chip being determined according to whether said fuses are one of connected or disconnected.

9. An integrated circuit chip comprising:
internal circuit means;
a pair of power supply terminals for supplying power to said internal circuit means;
a plurality of input terminals for supplying signals to said internal circuit means; and
identification circuit means, coupled between one of said power supply terminals and one of said input terminals, comprising:
  voltage limiting means for limiting a potential difference between said one power supply terminal and said one input terminal to a predetermined voltage level; and
  option means coupled to said voltage limiting means for optionally permitting current to flow therethrough;
  whereby said chip is identified according to whether said current flows through said identification circuit means.

10. An integrated circuit chip comprising:
internal circuit means;
a pair of power supply terminals for supplying power to said internal circuit means;
at least three input terminals for supplying signals to said internal circuit means; and
identification circuit means, coupled to one of said power supply terminals and at least three of said input terminals, comprising:
  voltage limiting means, coupled between said one power supply terminal and a first of said three input terminals, for limiting a potential difference between said one power supply terminal and said first input terminal to a predetermined voltage level and for generating a control voltage, said voltage limiting means comprising a plurality of MOS transistors connected in series with a resistor;
  a plurality of identification current paths coupled in parallel between a second and a third of said input terminals, each said path comprising a MOS transistor connected in series with a disconnectable member, said MOS transistor having a gate coupled to receive said control voltage generated by said voltage limiting means;
  whereby said chip is identifiable according to a sum of currents flowing through said plurality of identification current paths.

11. An integrated circuit chip according to claim 10, wherein said disconnectable member comprises a fuse which may be optionally connected or disconnected.

12. An integrated circuit chip according to claim 10, wherein said disconnectable member comprises a metal wire disposed between a gate and a source of a MOS transistor, said gate and source being optionally connected or disconnected by said metal wire.

* * * * *